United States Patent
Schwarz

(10) Patent No.: US 10,813,237 B2
(45) Date of Patent: Oct. 20, 2020

(54) HOUSING FOR USING AN ELECTRONIC DEVICE IN AN EXPLOSIVE ATMOSPHERE

(71) Applicant: ECOM Instruments GmbH, Assamstadt (DE)

(72) Inventor: Michael Schwarz, Igersheim (DE)

(73) Assignee: ECOM INSTRUMENTS GMBH (DE)

( * ) Notice: Subject to any disclaimer, the term of this patent is extended or adjusted under 35 U.S.C. 154(b) by 51 days.

(21) Appl. No.: 15/826,333

(22) Filed: Nov. 29, 2017

(65) Prior Publication Data

US 2018/0153052 A1 May 31, 2018

(30) Foreign Application Priority Data

Nov. 30, 2016 (DE) .................. 10 2016 223 789

(51) Int. Cl.
| | |
|---|---|
| *H05K 5/06* | (2006.01) |
| *F16B 43/00* | (2006.01) |
| *H05K 5/00* | (2006.01) |
| *F16B 37/12* | (2006.01) |

(52) U.S. Cl.
CPC ............ *H05K 5/06* (2013.01); *F16B 43/001* (2013.01); *H05K 5/0008* (2013.01); *H05K 5/061* (2013.01); *F16B 37/125* (2013.01)

(58) Field of Classification Search
CPC ........ H05K 5/06; H05K 5/061; H05K 5/0008; F16B 43/001; F16B 37/125; F16B 37/14; B60P 3/226; B65D 45/28; Y10S 411/91
USPC ........ 220/328, 325, 324, 315, 4.02, 3.8, 3.7; 174/562, 561, 560, 559, 520; 411/372.5, 411/372.6, 373, 374, 429
See application file for complete search history.

(56) References Cited

U.S. PATENT DOCUMENTS

| | | | | |
|---|---|---|---|---|
| 4,981,735 A | * | 1/1991 | Rickson | F16B 5/01 156/92 |
| 5,880,400 A | * | 3/1999 | Leischner | H02B 1/28 174/17 CT |
| 9,326,411 B2 | * | 4/2016 | Eichner | F16B 33/004 |

FOREIGN PATENT DOCUMENTS

DE 19634671 C2 8/1998

OTHER PUBLICATIONS

The evolution the the Ex-proof flame path, https://www.cortemgroup.com/sites/default/files/cortem/technical-documentation/pdf/the_evolution_of_the_ex-_proof_flame_path.pdf (Year: 2017).*

* cited by examiner

*Primary Examiner* — Ernesto A Grano
(74) *Attorney, Agent, or Firm* — Fishman Stewart PLLC

(57) ABSTRACT

A housing for receiving an electronic device in an explosive atmosphere may include a first housing part and second housing part coupled to one another via at least one screw connection defining a housing interior for receiving the electronic device. The screw connection may include a screw and a separate threaded pin. A recess may be defined in first housing part. A first threaded bush may be arranged in the recess for receiving the screw. A through-opening may be defined in the second housing part concentric to the recess and a second threaded bush may be arranged in the through-opening for partially receiving the screw and the threaded pin. The screw may be arranged in the through-opening and screwed into the first threaded bush coupling the first housing part and the second housing part to one another. The threaded pin may be screwed into the second threaded bush.

20 Claims, 2 Drawing Sheets

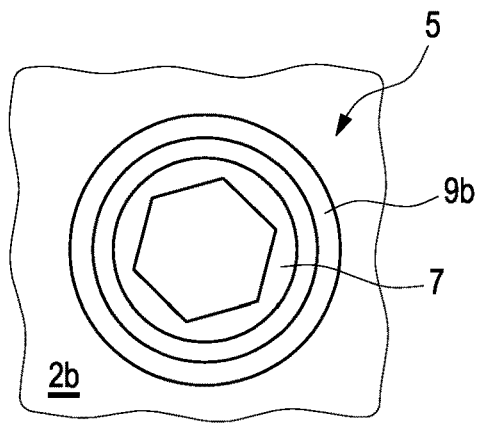
Fig. 2
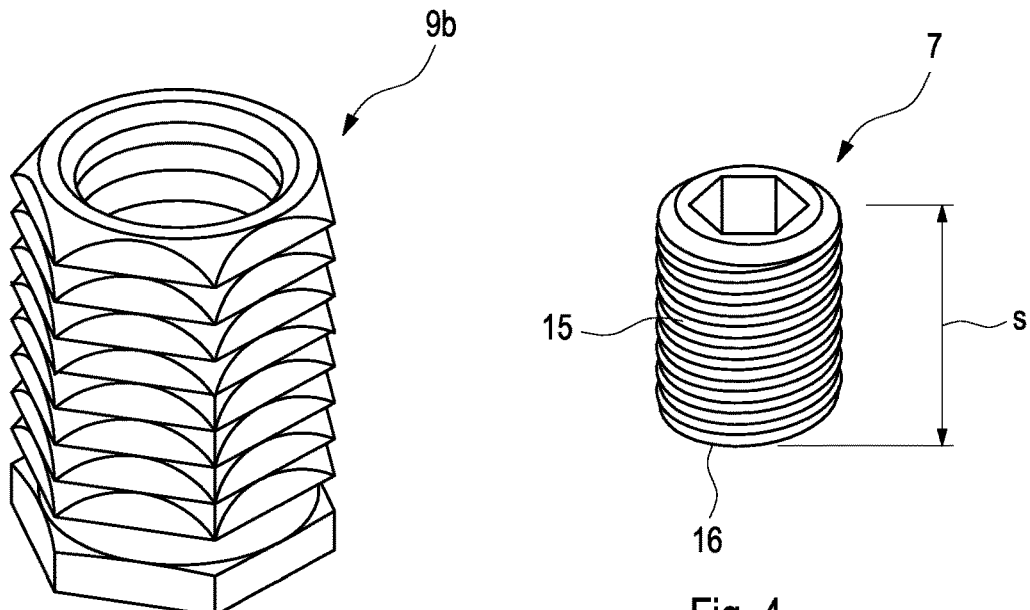
Fig. 3
Fig. 4
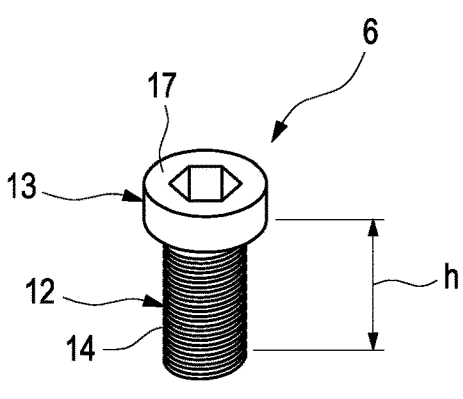
Fig. 5
Fig. 6

HOUSING FOR USING AN ELECTRONIC DEVICE IN AN EXPLOSIVE ATMOSPHERE

CROSS-REFERENCE TO RELATED APPLICATION

This application claims priority to German Application DE 10 2016 223 789.6 filed on Nov. 30, 2016, the contents of which are hereby incorporated by reference in their entirety.

TECHNICAL FIELD

The invention relates to a housing for housing an electronic device in an explosive atmosphere.

In so-called explosive environments such as on oil rigs the electrical energies present at external electronic interfaces of an electronic device could potentially ignite a gas/air mixture in the explosive atmosphere and thus cause an explosion. This applies, above all, to highly reactive gas mixtures as well as to hydrogen and oxygen mixtures, for which the said electrical energy is available as activating energy in order to initiate an exothermal reaction of hydrogen and oxygen with water. A similar scenario applies to dusts and aerosols.

BACKGROUND

Against this background it is known from the art to provide pressure-resistant housings suitable for accommodating the electronic device to be used in explosive environments.

A proven disadvantage with such conventional housings designed for use in explosive environments is that these housings must be of very robust construction because of the extremely high explosion pressure, which means that these housings are available only in very large dimensions or can no longer be opened again after assembly. Thus these conventional housings are not suitable for mobile devices, or it is not possible or possible only at a great deal of expense to again remove the electronic device received in the housing, from the housing for maintenance purposes.

The present invention is therefore engaged in the problem of proposing an improved design for a pressure-resistant housing for use in an explosive atmosphere, which due to a lower explosion pressure permits miniaturisation and a simple removal of the electronic device from the housing interior and which is thus especially suitable for the protection of mobile devices.

This requirement is met by the subject of the independent patent claims. Preferred embodiments are the subject of the dependent patent claims.

SUMMARY

Accordingly the basic idea of the invention consists in fastening two parts of the housing to one another by means of a screw connection, wherein the screw connection, according to the invention, comprises two fastening elements, i.e. a screw and a matching separate threaded pin. The screw is used, in a conventional manner, to fasten the two housing parts to each other. To this end the screw is passed through a through-opening arranged in the second housing part and screwed to a first threaded bush present in the first housing part. Above the screw the threaded pin is screwed into a second threaded bush inserted in the through-opening of the second housing part and serves to reduce the explosive energy in the said through-opening to below the ignition threshold in terms of a so-called "ex-thread-gap"— (Ex-Gewindespalt). In this way the desired releasable connection between the two housing parts is realised with the aid of a screw connection. At the same time it is ensured that the screw connection meets the requirements demanded from an "ex-gap".

The "ex-gap" (Ex-Spalt) or "ex-thread-gap" (Ex-Gewindespalt) in terms of the present invention is understood to be a clearance between the two housing parts or a clearance present in the screw connection for fastening the two housing parts to each other, which clearance is designed and/or dimensioned such that an explosion taking place in the housing interior enclosed by the two housing parts cannot be transferred through the clearance to the outside into an explosive atmosphere surrounding the housing.

A housing according to the invention comprises a first and a second housing part, which enclose a housing interior for receiving an electronic device and which are releasably fastened to each other by means of at least one screw connection. The screw connection is comprised of a screw consisting of a screw body with an external thread which axially transitions into a screw head which radially overreaches the screw body towards the outside. The screw connection further comprises a threaded pin separate from the screw as well as a recess formed on the topside of the first housing part, in which a first threaded bush for partially receiving the screw is arranged. The screw connection also comprises a through-opening in the second housing part arranged concentrically to the recess, in which a second threaded bush for partially receiving the screw and the threaded pin is arranged. The screw is received in the through-opening for fixing the two housing parts to each other and is screwed into the first threaded bush. Above the screw the threaded pin is screwed into the second threaded bush, in order to, in this way, create a gap between the second threaded bush and the threaded pin which in normative terms meets the requirements of an ex-gap.

According to a preferred embodiment the threaded pin and the second threaded bush are designed such that an ex-gap according to the above definition is formed between the threaded pin and the second threaded bush. This ensures that the compressive strength necessary for using the housing in an explosive atmosphere is adequate.

A particularly robust fixing of the screw in the second threaded bush is achieved in that an underside of the threaded pin facing the first housing part is supported against a topside of the screw, in particular the screw head, facing away from the first housing part.

According to a preferred embodiment a circumferential ex-gap as per the above-mentioned definition is formed laterally between the topside of the first housing part and the underside of the second housing part on a side of the screw connection facing away from the housing interior. This ensures that the compressive strength necessary for using the housing in an explosive atmosphere is adequate.

With a preferred further development a recess is provided laterally on the side of the screw connection facing away from the housing interior on the topside of the first housing part. This recess is engaged by a projection provided on the underside of the second housing part and formed complementary to the recess. In a variant of this further development the recess may be arranged in the second housing part and the projection may be arranged in the first housing part.

According to a further preferred embodiment a sealing means is arranged between the housing interior and the screw connection which serves to seal the housing interior against the external environment of the two housing parts. In case of a sudden strong rise in pressure in the immediate external environment of the housing or in case of a mechanical knock impacting the housing from outside, the two housing parts are pressed against each other in the area of the sealing means due to the lever effect created by the screw connection, so that the necessary sealing effect is ensured.

Especially preferably the projection and the recess are arranged in a longitudinal section along the axial direction on a side of the screw connection facing away from the sealing means. In case of a sudden strong rise in pressure in the housing interior, for example as a result of an explosion, the projection is pressed into the recess due to the lever effect created by the screw connection, so that the required sealing effect is ensured.

With an advantageous further development the sealing means comprises a sealing ring which is respectively partially received in a first receiving groove arranged on the topside of the first housing part. Alternatively or additionally the sealing ring may be received in a second receiving groove on the underside of the second housing part. The sealing means can be realised in a technically very simple manner with one or two sealing rings and a corresponding receiving groove.

With another preferred embodiment the recess formed in the first housing part and the through-opening formed in the second housing part extend along an axial direction. With this variant the sealing ring is arranged along the axial direction between the housing interior and the screw.

Especially preferably the threaded pin screwed into the second threaded bush closes the through-opening in order to keep the explosion energy below the ignition threshold thus preventing through-ignition.

With another advantageous further development the through-opening has a first axial portion, which transitions away from the underside of the second housing part via a radial step into a second axial portion. The second axial portion in this embodiment has a larger opening diameter than the first axial portion. Such a construction with two axial portions and a radial step allows the screw to be axially stably supported.

Conveniently the second threaded bush may be formed in the manner of a pot with a pot bottom, which is supported against the radial step.

Conveniently the two housing parts may be produced from a plastic and the two threaded bushes may be produced from a metal. By using a plastic as housing material, the manufacturing cost for the housing parts can be kept low. At the same time, by using metal, wear of the screw connection is kept low so that a multitude of fastening cycles is possible without this leading to a reduction in the lifetime of the screw connection or to excessive mechanical wear on the ex-gap.

With one advantageous further development an axially measured body height of the screw body is at least 5 mm. Alternatively or additionally in this further development, an axially measured thread length of the threaded pin is at least 5 mm if the housing volume enclosed by the housing is a maximum of 100 cm$^3$. With a housing volume of more than 100 cm$^3$ the thread length is at least 8 mm. With this further development the screw body must also meet those mechanical requirements, which result from the number of screw connections, the explosion pressure and the impacted surface.

With one advantageous further development at least five complete convolutions of the screw body are in engagement with the first threaded bush. With this further development a pitch of the convolutions is at least 0.7 mm.

Additionally the screw body in this further development is able to meet the mechanical requirements, which result from the number of screw connections, the explosion pressure and the impacted surface.

Further important features and advantages of the invention are revealed in the sub-claims, the drawings and the associated description of the figures with reference to the drawings.

It is understood that the above-mentioned features to be explained in detail below can be used not only in the combination described but also in other combinations or on their own without leaving the scope of the invention.

Preferred exemplary embodiments of the invention are depicted in the drawings and will now be explained in detail in the description below.

BRIEF DESCRIPTION OF THE DRAWINGS

In the schematic drawings

FIG. 2 shows a top view of the second housing part of the housing in the area of the screw connection, FIG. 3 shows the second threaded bush of the housing in a separate perspective view, FIG. 4 shows the threaded pin of the housing in a separate perspective view, FIG. 5 shows the first threaded bush of the housing in a separate perspective view, FIG. 6 shows the screw of the housing in a separate perspective view.

DETAILED DESCRIPTION

Figure 1:
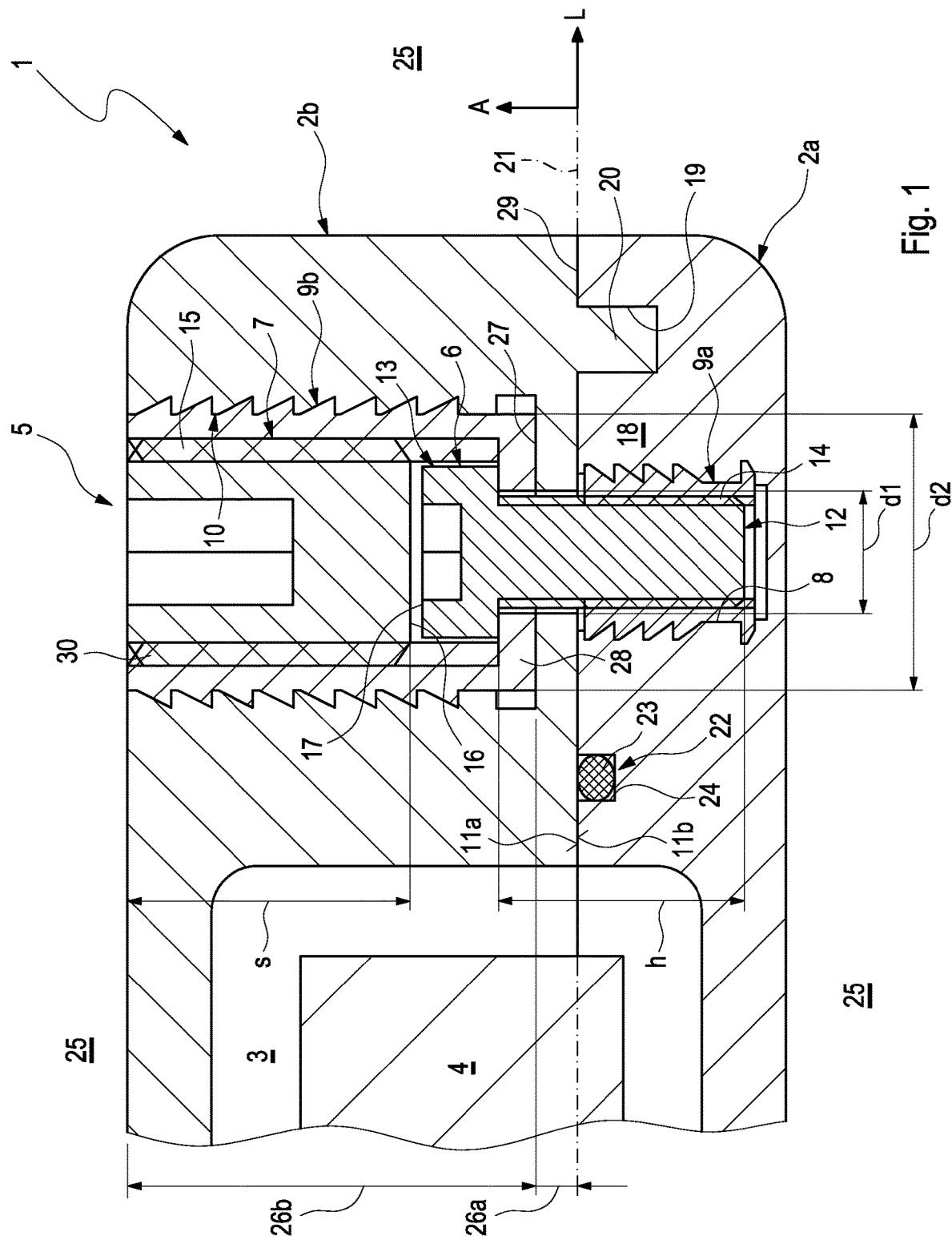
FIG. 1 shows an exemplary housing in a sectional view.

FIG. 1 shows an example of a housing 1 according to the invention in a sectional view. The housing 1 comprises a first and a second housing part 2a, 2b, which are releasably connected to each other by means of at least one screw connection 5. When fastened to each other the two housing parts 2a, 2b enclose a housing interior 3. An electronic device 4—indicated roughly schematically only in FIG. 1—can be arranged in the housing interior 3. The housing 1 with the two housing parts 2a, 2b realises a pressure-resistant encapsulation thereby ensuring protection against explosion (ex-protection) for the electronic device 4. Thus the device 4 arranged in the housing interior 3 can be used in explosive environments such as on an oil rig.

FIG. 1 shows the housing 1 in a sectional view in the area of the screw connection 5. FIG. 2 shows a top view on the second housing part 2b of the housing 1 in the area of the screw connection 5. As shown in FIGS. 1 and 2 the screw connection 5 comprises a screw 6 and a threaded pin 7. The screw 6 is shown in a separate perspective view in FIG. 6, the threaded pin 7 in FIG. 4.

The screw 6 comprises a screw body 12 with an external thread 14. The screw body 12 axially transitions into a screw head 13, which radially overreaches the screw body 12 towards the outside. The threaded pin 7 is formed separately from the screw 6 and has an external thread 15.

On a topside 11a of the first housing part 2a a recess 8 is formed, in which a first threaded bush 9a for partially receiving the screw 6 is arranged. The terms "topside" and "underside" refer to a possible operational use of the housing 1. The second housing part 2b has a through-opening 10 formed in it which extends concentrically to the recess 8. A second threaded bush 9b for receiving the screw 6 and the threaded pin 7 is arranged in the through-opening 10. The first threaded bush 9a is shown in a separate perspective view in FIG. 5. The second threaded bush 9b is shown in a separate perspective view in FIG. 3.

The through-opening 10 comprises a first axial portion 26a, which transitions away from the underside 11b of the second housing part 2b into a second axial portion 26b via a radial step 27. A (second) opening diameter d2 of the second axial portion 26b is larger than the (first) opening diameter d1 of the first axial portion 26a. The second threaded bush 9b is shaped as a pot and comprises a pot bottom 28, which is supported against the radial step 27. The recess 8 present in the first housing part 2a and the through-opening 10 formed in the second housing part 2b extend along an axial direction A.

As can be recognised in FIG. 1, the screw 6 for releasably fixing the two housing parts 2a, 2b to each other is received in the through-opening 10 and screwed into the first threaded bush 9a. The threaded pin 7 is screwed into the second threaded bush 9b above the screw 6. An underside 16 of the threaded pin 7 facing the first housing part 2a is supported against the topside 17 of the screw head 13 of the screw 6 facing away from the first housing part 2a.

The releasable fixing of the two housing parts 2a, 2b to each other is realised by means of the screw 6. Since a screw connection fixing the two housing parts 2a, 2b to each other is admissible under the explosion standard only if the screw connection 5 also forms an ex-gap, the threaded pin 7 is provided in addition to the screw 6 as part of the screw connection 5: between the threaded pin 7 and the second threaded bush 9b a gap is formed which meets the normative requirements of an ex-gap. In other words, the threaded pin 7 and the second threaded bush 9b are formed such that an ex-gap is realised between the threaded pin 7 and the second threaded bush 9b.

In the exemplary scenario an ex-gap or ex-thread-gap is understood to be a clearance between the two housing parts or a clearance existing in the screw connection for fixing the two housing parts to each other, which clearance is designed or dimensioned such that an explosion taking place in the housing interior enclosed by the two housing parts cannot be transferred through the clearance to the outside into the explosive atmosphere surrounding the housing.

In order to ensure this, an axially measured thread length s of the threaded pin 7 comprises the minimum value required in order to meet the said explosion standard. This minimum value of the thread length s is preferably at least 5 mm for a housing volume enclosed by the housing 1, of up to 100 cm$^3$. For a housing volume of more than 100 cm$^3$, a thread length s of at least 8 mm is recommended.

In the exemplary scenario at least five complete convolutions of the screw body 12 are in engagement with the first threaded bush 9a. The pitch of the convolutions is at least 0.7 mm. In addition the screw body 12 should meet the mechanical requirements based on the number of screw connections, the explosion pressure and the impacted surface.

In addition an axially measured body height h of the screw body may be at least 5 mm. In conclusion therefore, with the housing 1, a pressure-resistant encapsulation of the housing interior 3 as per explosion standard is realised by the two housing parts 2a, 2b, wherein the screw connection 5 is instrumental in achieving a releasable fixing of the two housing parts 2a, 2b to each other.

As can be further recognised in FIG. 1 a contact surface 21 is defined by the topside 11a of the first housing part 2a and an underside 11b of the second housing part 2b, when the two are fixed to each other. Due to the position of the contact surface 21 a lateral direction L is defined in turn in the sectional view, which extends vertically to the axial direction A of the through-opening 10. As regards the lateral direction L an ex-gap 29 as per the above-mentioned definition is formed at least in sections between the topside 11a of the first housing part 2a and the underside 11b of the second housing part 2b on a side 18 of the screw connection 5 facing away from the housing interior 18. To form the ex-gap a recess 19 is arranged on the topside 11a of the first housing part 2a and—with respect to the lateral direction L—on the side 18 of the screw connection facing away from the housing interior 3. This recess 19 is engaged by a projection 20 provided on the underside 11b of the second housing part 2b and formed complementary to the recess 19. In a variant (not shown) the projection 20 may be arranged on the first housing part 2a and the recess 19 may be arranged on the second housing part 2b. A sealing means 22 is arranged between the housing interior 3 and the screw connection 5 for sealing the housing interior 3 against the external environment 25 of the two housing parts 2a, 2b.

In the longitudinal section along axial direction A shown in FIG. 1 the sealing means 22 is arranged laterally between the housing interior 3 and the screw 6. Furthermore in the longitudinal section along axial direction A the projection 20 and the recess 19 are arranged on the side of the screw 6 which faces away from sealing means 22. The sealing means 22 comprises a sealing ring 23. The sealing ring 23 is at least partially arranged in a first receiving groove 24 arranged on the topside 11a of the first housing part 2a. Alternatively the sealing ring 23 may be received in a second receiving groove (not shown in the figures) arranged on the underside 11b of the second housing part 2b. Also feasible is a variant not shown in detail in the figures with two receiving grooves, which are provided both on the topside 11a of the first housing part 2a and on the underside 11b of the second housing part 2b (not shown). The two housing parts 2a, 2b may consist of plastic. The two threaded bushes 9a, 9b may consist of a metal and may be injection-moulded into the first or second housing part 2a, 2b. In an embodiment of the housing parts 2a, 2b from a metal the threaded bushes 9a, 9b may be omitted if the threaded bushes 9a, 9b are worked directly into the housing parts 2a, 2b.

The housing 1 may comprise a number of screw connections 5, which are arranged laterally in circumferential direction around the housing interior 3 and arranged at a distance from each other.

The functionality/operational principle of the screw connection 5 as an ex-gap will now be explained in detail. If there occurs a build-up in raised pressure in the housing interior 3 as a result of an explosion caused e.g. by the electronic device arranged in the housing interior 3, the two housing parts 2a, 2b are pressed apart. The screw connection 5 with screw 6 ensures that laterally on the side 18 of the screw connection 5 facing away from the housing interior 3, i.e. in the area of the recess 19/the projection 20, the underside 11b of the second housing part 2b is pressed against the topside 11a of the first housing part 2a. The point of leverage is the screw 6. If there exists a gap 29 between the topside 11a of the first housing part 2a and the underside 11b of the second housing part 2b, the width of the gap is reduced at least to the extent that the demands which the ex-gap has to meet are substantially or even completely fulfilled. In this way the tightness of the housing 1 normatively demanded for protection against explosion is ensured.

If on the other hand an external mechanical pressure impacts on the two housing parts 2a, 2b in the area of the housing interior 3, which may for example be caused by an external mechanical knock, the two housing parts 2a, 2b are pressed together in particular in the area of the sealing means 22, wherein again the screw 6 acts as a point of leverage. Due to the increased sealing effect involved the tightness of the housing 1 is again improved so that the tightness of the housing 1 normatively required 1 for protection against explosion is also ensured in case of an external pressure or knocking impact.

The invention claimed is:

1. A housing for receiving an electronic device in an explosive atmosphere, comprising:
a first housing part and a second housing part defining a housing interior for receiving the electronic device, wherein the first housing part and the second housing part are releasably connected to each other via at least one screw connection;
wherein the at least one screw connection comprises:
a screw having a screw body including an external thread, the screw body axially transitioning into a screw head that radially overreaches the screw body;
a threaded pin separate from the screw;
a recess defined in a topside of the first housing part;
a first threaded bush arranged in the recess for partially receiving the screw;
a through-opening defined in the second housing part concentric to the recess;
a second threaded bush arranged in the through-opening for partially receiving the screw and the threaded pin;
wherein the screw is arranged in the through-opening and is screwed into the first threaded bush to fasten the first housing part and the second housing part to one another; and
wherein the threaded pin is screwed into the second threaded bush.

2. The housing according to claim 1, wherein the threaded pin and the second threaded bush are configured to define an ex-gap between the threaded pin and the second threaded bush.

3. The housing according to claim 1, wherein an underside of the threaded pin facing the first housing part is supported against a topside of the screw facing away from the first housing part.

4. The housing according to claim 3, wherein a circumferential ex-gap is defined laterally on a side of the at least one screw connection facing away from the housing interior between the topside of the first housing part and an underside of the second housing part.

5. The housing according to claim 3, wherein a second recess is defined laterally on a side of the at least one screw connection facing away from the housing interior on the topside of the first housing part, wherein the second recess is engaged by a projection provided on an underside of the second housing part, wherein the second recess and the projection are configured to complement each other.

6. The housing according to claim 1, wherein a seal is arranged between the housing interior and the at least one screw connection for sealing the housing interior against an external environment of the first housing part and the second housing part.

7. The housing according to claim 6, wherein:
a second recess is defined in the topside of the first housing part;
an underside of the second housing part includes a projection engaged in the second recess, the projection and the second recess extending in an axial direction relative to the screw; and
the projection and the second recess are disposed laterally on a side of the at least one screw connection facing away from the seal.

8. The housing according to claim 6, wherein the seal comprises a sealing ring arranged at least partially within at least one of a first receiving groove defined in the topside of the first housing part and a second receiving groove defined in an underside of the second housing part.

9. The housing according to claim 6, wherein:
the recess defined in the first housing part and the through-opening defined in the second housing part extend along an axial direction; and
wherein the seal is arranged along the axial direction between the housing interior and the screw.

10. The housing according to claim 1, wherein the threaded pin screwed into the second threaded bush closes the through-opening.

11. The housing according to claim 1, wherein the through-opening comprises a first axial portion transitioning away from an underside of the second housing part via a radial step into a second axial portion, wherein the second axial portion has a larger opening diameter than the first axial portion.

12. The housing according to claim 11, wherein the second threaded bush is pot-shaped with a pot bottom supported against the radial step.

13. The housing according to claim 1, wherein the first housing part and the second housing part are composed of a plastic and the first threaded bush and the second threaded bush are composed of a metal.

14. The housing according to claim 1, wherein at least five complete convolutions of the external thread around the screw body are in engagement with the first threaded bush, wherein a pitch of the at least five convolutions is at least 0.7 mm.

15. The housing according to claim 1, wherein an axially measured body height of the screw body is at least 5 mm.

16. The housing according to claim 1, wherein an axially measured thread length of the threaded pin is at least 5 mm.

17. The housing according to claim 1, wherein an axially measured thread length of the threaded pin is at least 8 mm.

18. The housing according to claim 1, wherein at least one of:
the first threaded bush and the first housing part are integrally provided as a single component such that a portion of the first housing part defines the first threaded bush; and
the second threaded bush and the second housing part are integrally provided as a single component such that a portion of the second housing part defines the second threaded bush.

19. A housing for receiving an electronic device in an explosive atmosphere comprising:
a first housing part and a second housing part defining a housing interior for receiving the electronic device, wherein the first housing part and the second housing part are releasably connected to each other via at least one screw connection;
wherein the at least one screw connection comprises:
a screw having a screw body including an external thread, the screw body axially transitioning into a screw head that radially overreaches the screw body;
a threaded pin structured as a separate component from the screw;
a recess defined in a topside of the first housing part;
a first threaded bush arranged in the recess and configured to at least partially receive the screw;

a through-opening defined in the second housing part concentric to the recess;
a second threaded bush arranged in the through-opening and configured to at least partially receive the screw and the threaded pin;
the screw arranged partially in the through-opening and partially in the recess and screwed into the first threaded bush to releasably fix the first housing part and the second housing part to one another;
the threaded pin screwed into the second threaded bush;
wherein an ex-gap is defined between the threaded pin and the second threaded bush; and
wherein a seal is arranged between the housing interior and the at least one screw connection for sealing the housing interior against an external environment of the first housing part and the second housing part.

20. A housing for receiving an electronic device in an explosive atmosphere comprising:
a first housing part having a topside in which a first recess and a second recess are defined;
a second housing part having an underside in which a through-opening concentric to the first recess is defined, the second housing part including a projection structured complimentary to the second recess protruding from the underside;
a first threaded bush arranged in the first recess;
a second threaded bush arranged in the through-opening;
a screw having a screw head and a screw body including a helical external thread, the screw body axially transitioning into the screw head that radially overreaches the screw body;
a threaded pin structured as a separate component from the screw;
the screw arranged partially in the through-opening and partially in the first recess and screwed into the first threaded bush releasably coupling the first housing part and the second housing part to one another such that the first housing part and the second housing part define a housing interior for receiving the electronic device;
the threaded pin screwed into the second threaded bush defining a first ex-gap therebetween; and
wherein the projection and the second recess are disposed on a lateral side of the screw opposite the housing interior, and wherein the projection is engaged in the second recess defining a second ex-gap between the topside of the first housing part and the underside of the second housing part.

* * * * *